United States Patent
Arz et al.

(10) Patent No.: US 6,831,461 B2
(45) Date of Patent: Dec. 14, 2004

(54) MAGNETIC RESONANCE TOMOGRAPHY APPARATUS HAVING DAMPING LAMINATED SHEETS FOR REDUCING VIBRATIONS

(75) Inventors: Winfried Arz, Erlangen (DE); Franz Boemmel, Erlangen (DE); Peter Dietz, Nuremberg (DE); Matthias Weber, Fuerth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/200,416

(22) Filed: Jul. 22, 2002

(65) Prior Publication Data

US 2003/0025582 A1 Feb. 6, 2003

(30) Foreign Application Priority Data

Jul. 23, 2001 (DE) .......................................... 101 35 836

(51) Int. Cl.⁷ ................................................ G01V 3/00
(52) U.S. Cl. ........................................ 324/318; 324/322
(58) Field of Search ................................. 324/318, 322, 324/300, 314, 307, 309, 306

(56) References Cited

U.S. PATENT DOCUMENTS

| | | | |
|---|---|---|---|
| 4,954,781 A | * | 9/1990 | Hirata .......................... 324/318 |
| 5,084,676 A | | 1/1992 | Saho et al. |
| 5,235,283 A | * | 8/1993 | Lehne et al. ................. 324/318 |
| 5,617,026 A | | 4/1997 | Yoshino et al. |
| 5,793,210 A | | 8/1998 | Pla et al. |
| 5,841,279 A | | 11/1998 | Hayashi et al. |
| 5,952,829 A | | 9/1999 | Melcher et al. |
| 6,107,799 A | | 8/2000 | Sellers et al. |
| 6,469,510 B2 | * | 10/2002 | Drobnitzky ................. 324/318 |

FOREIGN PATENT DOCUMENTS

| | | |
|---|---|---|
| EP | 0 981 057 | 2/2000 |
| EP | 1 209 479 | 5/2002 |
| JP | 5000132 | 1/1993 |

* cited by examiner

Primary Examiner—Louis Arana
(74) Attorney, Agent, or Firm—Schiff Hardin LLP

(57) ABSTRACT

In an MR tomography apparatus damping laminated sheets are provided for reducing vibrations The MR tomography apparatus has a magnet body which is surrounded by a magnet housing which surrounds and delimits an interior volume. A gradient coil system is located in this interior volume. On an inner side of the magnet housing that delimits the interior volume, a damping laminated sheet structure is provided for absorbing acoustic vibrations which are produced on switching of the gradient coil system.

10 Claims, 4 Drawing Sheets

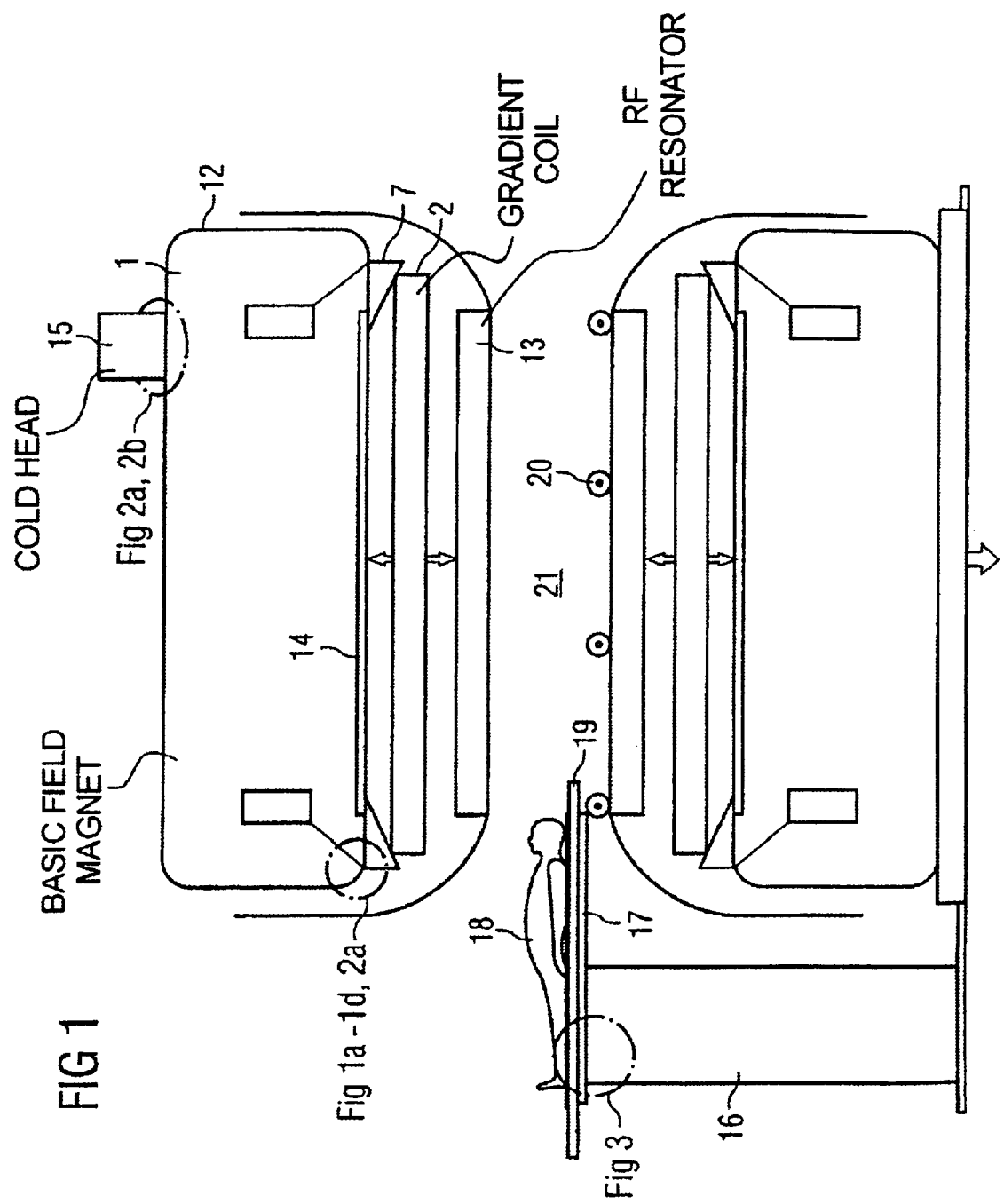

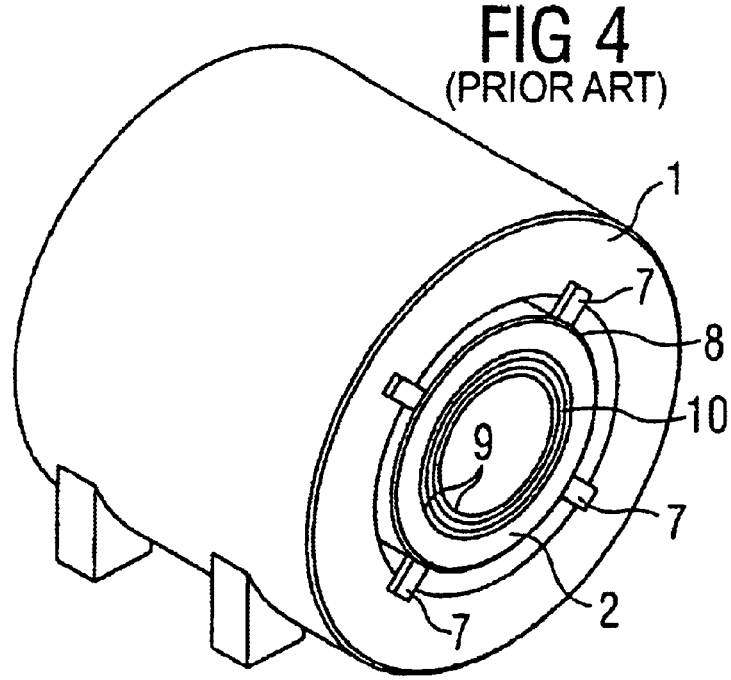
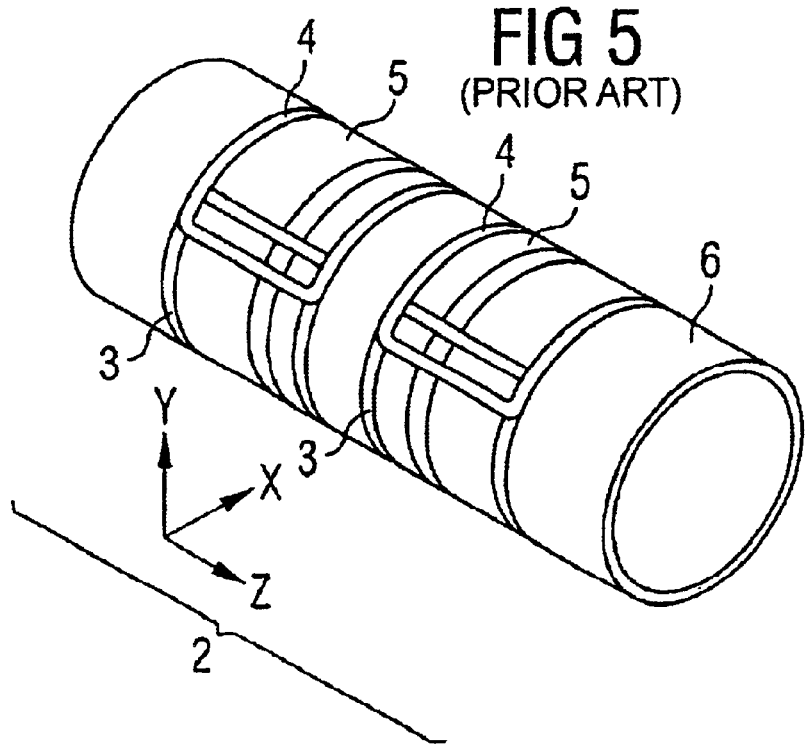

MAGNETIC RESONANCE TOMOGRAPHY APPARATUS HAVING DAMPING LAMINATED SHEETS FOR REDUCING VIBRATIONS

BACKGROUND OF THE INVENTION

1. Field of the Invention

The present invention relates in general to magnetic resonance (MR) tomography as used in medicine for examining patients. The present invention relates in particular to an MR tomography apparatus of the type wherein vibrations of apparatus components which negatively influence many aspects of the overall system are reduced.

2. Description of the Prior Art

MR tomography is based on the physical phenomenon of nuclear spin resonance and has been used successfully as an imaging method for over 15 years in medicine and in biophysics. In this method of examination, the object is exposed to a strong, constant magnetic field. This aligns the nuclear spins of the atoms in the object, which were previously oriented irregularly. Radio-frequency energy can now excite these "ordered" nuclear spins to a specific oscillation. In MR tomography, this oscillation generates the actual measurement signal which is picked up by means of suitable receiving coils. By the magnetic fields which are not spatially constant, generated by gradient coils, it is possible to spatially code the measurement signals from the object in all three spatial directions. The method permits a free choice of the layer to be imaged, so that it is possible to obtain tomographic images of the human body in all directions. MR tomography in medical diagnostics is distinguished first and foremost as a "non-invasive" method of examination by a versatile contrast capability. MR tomography currently uses sequences with high gradient performance which permit an excellent image quality with measuring times of the order of magnitude of seconds and minutes.

Continuous technical development of the components of MR systems, and the introduction of high-speed imaging sequences have opened ever more fields of use for MR tomography in medicine. Real time imaging for supporting minimally invasive surgery, functional imaging in neurology and perfusion measurement in cardiology are only a few examples.

The basic design of the examination portion of such an MR apparatus is illustrated in FIG. 4. This has a basic field magnet 1 (for example an axial superconducting air-coil magnet with active stray field shielding) which generates a homogeneous magnetic basic field its interior volume. The superconducting magnet 1 has superconducting coils which are contained in a vessel of liquid helium. The basic field magnet 1 is surrounded by a two-shell vessel arrangement which is made from stainless steel, as a rule. The inner vessel, which contains the liquid helium, and serves in part also as a winding body for the magnet coils, is suspended at the outer vessel, which is at room temperature, via fiber-glass-reinforced plastic rods which are poor conductors of heat. A vacuum prevails between inner and outer vessels.

The cylindrical gradient coil arrangement 2 in the interior of the basic field magnet 1 is inserted concentrically into the interior of a support tube by means of support elements 7. The support tube is delimited externally by an outer shell 8, and internally by an inner shell 9. The function of the layer 10 will be explained later.

The gradient coil arrangement 2 has three such windings which, respectively generate gradient fields, proportional to the current impressed in each case, and which are spatially perpendicular to one another. As illustrated in FIG. 5, the gradient coil 2 has an x-coil 3, a y-coil 4 and a z-coil 5, which are respectively wound around the coil core 6 and thus generate respective gradient fields in the directions of the Cartesian coordinates x, y and z. Each of these coils is provided with a dedicated power supply unit in order to generate independent current pulses with accurate amplitudes and timing in accordance with the sequence programmed in the pulse sequence controller. The required currents are approximately 250 A. Since the gradient switching time is to be as short as possible, current rise rates of the order of magnitude of 250 kA/s are necessary. In an exceptionally strong magnetic field such as is generated by the basic field magnet 1 (typically between 0.22 and 1.5 tesla), such switching operations are associated with strong mechanical vibrations because of the Lorentz forces that occur. All system components (housing, covers, vessels of the basic field magnet and magnet housing, respectively, RF body coil etc.) are excited to produce forced vibrations.

Since the gradient coil is generally surrounded by conductive structures (for example magnet vessel made from stainless steel), the pulsed fields start in eddy currents in such structures, which exert forces on these structures due to interaction with the basic magnetic field, and likewise excite these structures to vibrations.

There is one further source of vibration which chiefly excites the magnet vessel to vibrations. This is the so-called cold head 15, which ensures that the temperature of the basic field magnet 1 is maintained. The cold head 15 is driven by a compressor and exerts mechanical forces on the housing of the basic field magnet 1.

These vibrations of the various MR components act negatively in many ways on the MR system:

1. Decidedly stronger airborne noise is produced, which constitutes an annoyance to the patient, the operating staff and other persons in the vicinity of the MR system.

2. Vibrations of the gradient coil and of the basic field magnet, and their transmission to the RF resonator and the patient couch in the interior of the basic field magnet and/or the gradient coil, are expressed in inadequate clinical image quality which can even lead to misdiagnosis (for example in the case of functional imaging, fMRI).

3. High costs arise also due to the need for a vibration-damping system setup—similar to that of an optical table—in order to prevent transmission of the vibrations to the ground, or vice versa.

In known systems, the transmission of vibrational energy between the gradient coil and tomograph is countered by the use of mechanical and/or electromechanical vibration dampers.

German Offenlegungsschrift 197 22 481 discloses an MR tomography apparatus which has a magnet body surrounded by a magnet housing, and this magnet housing surrounds and delimits an interior. A gradient coil system is located in this interior. A damping structure is provided on an inner side, delimiting the interior, of the magnet housing for absorbing acoustic vibrations which are caused by switching the currents generating the gradient fields. At least one damping cushion is formed of liquid, gaseous or flowable materials.

German Offenlegungsschrift 197 34 138 likewise discloses the use of passively acting elastomeric damping elements (for example rubber bearings), as well as the encapsulation of the gradient coil in a separate vacuum housing.

Normally use is made as well of the following further passive measures in order to reduce the vibrations:

general encapsulation of the source of vibration use of thicker and heavier materials damping layers (for example tar) applied from "outside".

In particular, the noise production path over the interior of the MR apparatus, i.e., production of noise by vibration of the gradient coil and transmission of the noise to the support tube located in the gradient coil (FIG. 4), which emits the noise inwardly to the patient and the interior, is blocked in the system disclosed in U.S. Pat. No. 4,954,781 by a damping viscoelastic layer 10 (FIG. 4) in the double-ply inner layer 9 of the support tube.

Furthermore, it is known to achieve this by inserting sound-absorbing so-called acoustic foams into the region between support tube and gradient coil.

German Offenlegungsschrift 196 43 116 discloses the integration of magnetostrictive materials, in particular into the gradient coil, permitting active, controlled opposing vibration-countering during operation, thereby reducing the vibration amplitude of the gradient coil.

German Patentschrift DE 44 32 747 likewise teaches the use of active damping, but by means of integrated electrostrictive piezoelectric actuators.

Nevertheless, the acoustic emission of a conventional apparatus continues to be very high.

SUMMARY OF THE INVENTION

It is an object of the present invention to further reduce the noise transmission during operation of an MR apparatus.

This object is achieved according to the invention in an MR tomography apparatus having a magnet body surrounded by a magnet housing which surrounds and delimits an interior volume, with a gradient coil system located in this interior volume. Provided on an inner side, delimiting the interior, of the magnet housing is a damping laminated sheet structure for absorbing acoustic vibrations which are produced by switching of the gradient coil system.

The annoyance represented as noise is advantageously reduced thereby. Moreover, the transmission of vibrations to the RF resonator and the patient couch is reduced so that the clinical image quality is not substantially impaired.

There are various possibilities for configuring the design of the damping laminated sheet structure:

If the damping laminated sheet structure constitutes an open system, an inner sheet forms the vacuum-bearing inner wall of the magnet housing, and the actually damping outer wall of the magnet housing is formed by an outer sheet together with a damping plane lying between the two sheets.

The open system advantageously extends in this case only over the partial surface of the magnet housing which faces the interior.

If the damping laminated sheet structure constitutes a closed system, both the inner sheet and the outer sheet form the vacuum-containing wall of the magnet housing, a damping plane being located between the two sheets.

The closed system then advantageously extends only over the partial surface of the magnet housing which faces the interior.

However, it can also be advantageous for the closed system to extend over the entire surface of the magnet housing.

The damping laminated sheet structure is advantageously formed from two sheets together with a damping plane located therebetween.

However, it can also be advantageous to form the damping laminated sheet structure in a multilayer design as a closed system composed of a number of sheets together with damping planes lying therebetween.

In this case, the damping plane is advantageously a viscoelastic layer.

In order to prevent transmission of the mechanical vibrations of the cold head to the magnet housing, in a further embodiment of the present invention the damping laminated sheet structure is laid in annular fashion around the cold head in the form of an open or closed system.

DESCRIPTION OF THE DRAWINGS

FIG. 1 schematically illustrates a section through the basic field magnet and the components of the interior which it encloses, in which the inventive damping arrangement is employed.

FIG. 4 is a perspective view of the basic field magnet according to the prior art.

FIG. 5 is a perspective view of the gradient coil with three sub-windings according to the prior art.

DESCRIPTION OF THE PREFERRED EMBODIMENTS

Figure 1A:
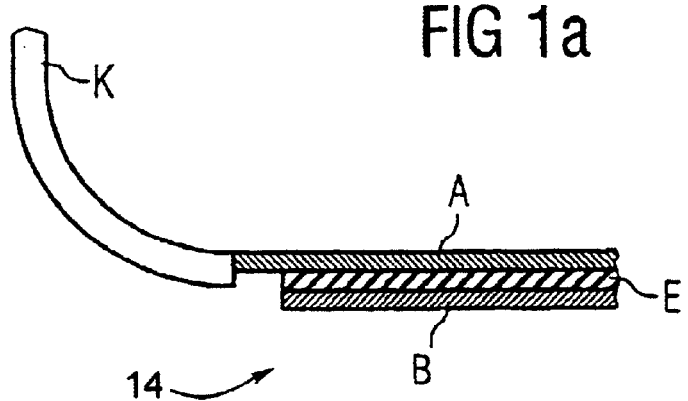
FIG. 1*a* shows a section through an inventive damping laminated sheet structure in an open system embodiment.

FIG. 1 shows a schematic section through the basic field magnet 1 of an MR apparatus and through further components of the interior volume which the magnet encloses. The basic field magnet 1 includes superconducting magnet coils which are located in liquid helium, and is surrounded by a magnet housing 12 in the form of a two-shell vessel. The so-called cold head 15 fitted outside on the magnet housing 12 is responsible for keeping the temperature constant. The gradient coil 2 is suspended concentrically via support elements 7 in the interior volume surrounded by the magnet housing 12 (also termed magnet vessel). The radio-frequency resonator 13 is likewise inserted concentrically, in turn, in the interior of the gradient coil 2. The task of the resonator 13 is to convert the RF pulses output by a power transmitter into an alternating magnetic field for the purpose of exciting the atomic nuclei of the patient 18, and subsequently to convert the alternating field emanating from the precessing nuclear spins into a voltage fed to the reception channel. Lying on a patient bed 19, which is located on a slide rail 17, the patient 18 is moved via rollers 20 fitted on the RF resonator 13, into the opening and the interior volume of the system. The slide rail is mounted on a vertically adjustable supporting frame 16.

The system illustrated diagrammatically in FIG. 1 now has two sources of vibration or vibration centers. These are the cold head 15 and the gradient coil 2.

The present invention permits the transmission of noise to be reduced at specific strategic points by the use of individual components constructed in a laminated fashion.

The strategic points addressed, at which damping laminated sheet structures are to be used, are the magnet housing 12, in particular the region of the magnet inner side 14 (warm bore) particularly sensitive to vibration, the region around the cold head 15 and the patient bed and associated components 16, 17 and 19.

Since the vibrating parts have a virtually continuous natural vibration spectrum, it is more effective for vibration reduction, particularly for higher frequencies (>100 Hz), to increase the damping of the layer than the mass or the stiffness. This can be implemented conventionally by applying heavy-gauge films. In the case of the magnet housing 12, a metal surface is advantageous both in terms of vacuum technology and in design (size, hard surface) and construction (tolerances). With reference to the thickness, a damping laminated sheet has the greatest reduction in vibration by comparison with other passive methods. The natural stiffening by the laminated structure ensures a greater stiffness in relation to weight.

The integration of vibration-damping properties into the structure of the corresponding components exhibits no disadvantages in design and functionality in this case. The use of a damping laminated sheet diminishes the vibration amplitudes by a factor of >10 without restricting functionality or design. At present, laminated sheets are already available commercially on a large scale in a sandwich structure (BONDAL steel, Krupp-Hösch company) or can be easily produced (using, for example, 3M Scotchdamp® between the sheet plies).

Various designs are conceivable according to the invention:

FIG. 1a shows a system which is in two layers only at the inner side 14, delimiting the interior 21, of the magnet housing 12. Like the end face K, the inner layer A has the task of maintaining the vacuum in the interior of the magnet housing 12 against the air pressure prevailing outside. This requires an adequate mechanical stiffness in order to withstand the static sub-atmospheric load. In the system illustrated in FIG. 1a, only the inner side 14, delimiting the interior 21, of the magnet housing 12 is provided with a further sheet lamination B. This need not be vacuum-tight. Its purpose is to increase the stiffness and the damping of the inner side 14. The actual damping is effected, however, by a damping layer which is illustrated between the two sheet laminations A and B as middle layer E. This is bonded to the adjacent metal layers A and B. Since the outer layer B in FIG. 1a has no supporting function, the illustrated structure of the magnet housing 12 is denoted as an open system.

Figure 1B:
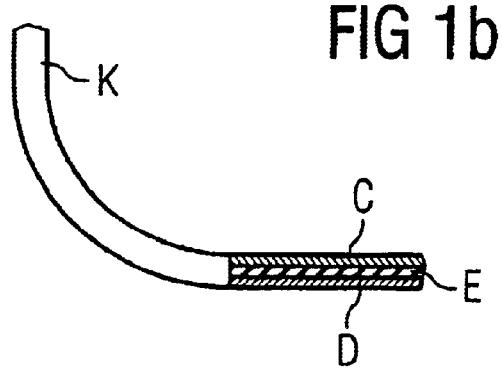
FIG. 1*b* shows a section through an inventive damping laminated sheet structure in a closed system embodiment which extends only over the partial surface of the magnet housing which faces the interior.
Figure 1C:
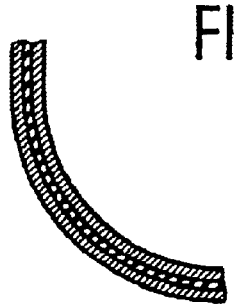
FIG. 1*c* shows a section through an inventive damping laminated sheet structure in a closed system embodiment which extends over the entire surface of the magnet housing.

By contrast, FIG. 1b shows a closed system. Here, the inner side 14, delimiting the interior 21, of the magnet housing 12 likewise has an inner layer C and an outer layer D. Likewise located between the two layers is a damping layer E. The difference from the open system in FIG. 1a is, however, that together with the inner layer C the outer layer D must also, like the end face K, withstand the ultra high vacuum in the interior of the magnet housing 12. The two layers or sheets C and D are therefore welded to one another and to the shell K and thereby form a closed structural unit in the form of a sandwich design. This closed system is certainly more costly, but has a higher stiffness and thereby blocks the transmission of noise all the better. The sheet thicknesses of the respective layers can be the same in both systems, or else different. In the embodiments of FIGS. 1a and 1b, a layered design is illustrated with a viscoelastic intermediate layer exclusively in the region of the warm bore 14, that is particularly sensitive to vibration (FIG. 1) is illustrated. However, a damping laminated sheet structure over the entire magnet housing 12 is also conceivable, as illustrated in FIG. 1c.

Figure 1D:
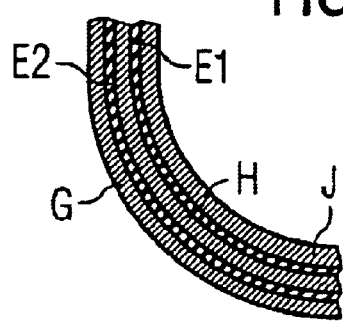
FIG. 1*d* shows a section through an inventive damping laminated sheet structure in a closed system embodiment composed of a number of sheets having damping planes located therebetween.

Damping which is more expensive but more effective is achieved by means of a layered design with more than two sheet laminations as in FIG. 1d, for example three sheet laminations G, H, J.

Figure 2A:
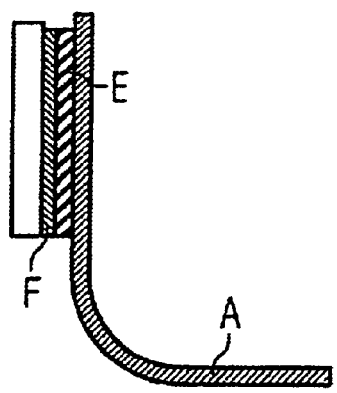
FIG. 2*a* shows a section through the magnet housing at the end face, with radially arranged stiffeners.
Figure 2B:
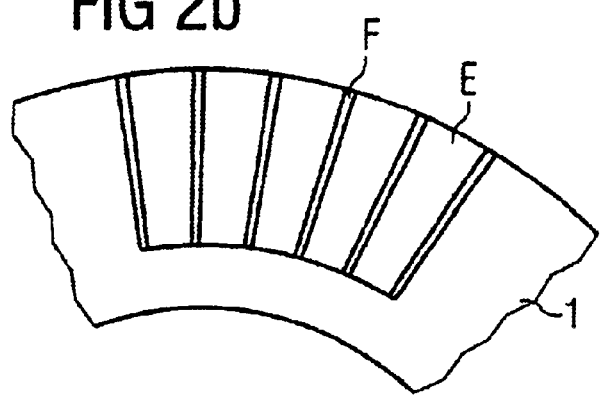
FIG. 2*b* shows the front view of the end face of the basic field magnet, with radially arranged stiffeners.

As mentioned above, a multilayer design increases the natural stiffness of the corresponding surface. A still higher stiffness is obtained at the end face of the magnet housing 12, in particular, by fitting additional radially arranged stiffeners F (FIG. 2a, sectional image and FIG. 2b, front view).

The design possibilities set forth above are suitable for preventing the spread of vibrations in the case of suitably adapted integration, specifically by annular isolation of the source of vibration, such as the cold head 15, for example.

Figure 3:
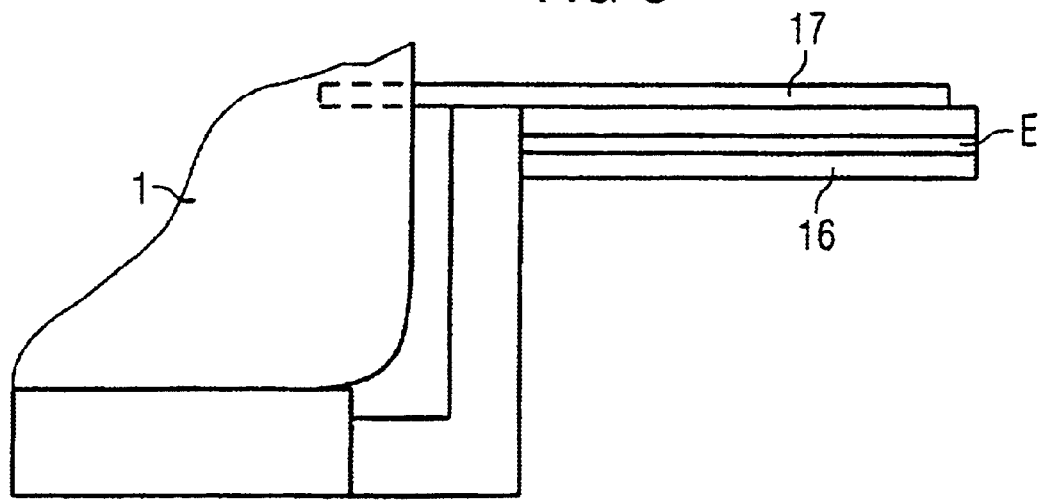
FIG. 3 shows the patient bed, the vibrations of which are damped by integrating inventive damping layers into the support structure.

A patient bed is illustrated in FIG. 3. A trough-shaped board 19 on which the patient lies is mounted on a slide rail 17. The slide rail 17, itself horizontally movable, is located on a vertically adjustable supporting frame 16 by means of which the bed can be brought with the patient to the level of the roller bearings 20 and can be moved into the opening of the system.

Transmission of the vibrations of the magnet and/or the RF resonator to the patient bed components 16, 17, 19 likewise can be prevented by integrating damping layers E into the support structure of the bed, such as into the board 19 and the slide rail 17 or between two parts, between the supporting frame 16 and slide rail 17, as well as by a damping roller bearing 20.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a magnetic resonance tomography apparatus having a magnet body surrounded by a magnet housing which surrounds and delimits an interior volume, said housing having a housing wall, and a gradient coil system disposed in said interior volume, the improvement comprising:
   a laminated sheet damping structure disposed at an inner side of said magnet housing delimiting said interior volume, for absorbing acoustic vibrations which are produced by switching of said gradient coil system, said laminated sheet damping structure comprising multiple sheets and at least one of said sheets structurally forming said housing wall.

2. The improvement of claim 1 wherein said housing wall is an inner wall containing a vacuum, and wherein said laminated sheet damping structure comprises an open system having an inner sheet forming said inner wall of said magnet housing, and having an outer sheet forming a damping outer wall of said magnet housing, with a damping plane disposed between said inner sheet and said outer sheet.

3. The improvement of claim 2 wherein said magnet housing has a surface facing said interior volume, and wherein said open system extends only over said surface.

4. The improvement of claim 1 wherein said housing wall is a vacuum-containing wall, and wherein said laminated sheet damping structure comprises a closed system having an inner sheet and an outer sheet both forming said wall, with a damping plane disposed between said inner sheet and said outer sheet.

5. The improvement of claim 4 wherein said magnet housing has a surface facing said interior volume, and wherein said closed system extends only over said surface.

6. The improvement of claim 4 wherein said closed system forms an entirety of an exterior surface of said magnet housing.

7. The improvement of claim 1 wherein said laminated sheet damping structure comprises two sheets with damping plane disposed therebetween.

8. The improvement of claim 1 wherein said laminated sheet damping structure comprises a multilayer closed system having a plurality of sheets with respective damping planes disposed between said sheets.

9. The improvement of claim 8 wherein said damping plane comprises a viscoelastic layer.

10. The improvement of claim 1 wherein said laminated sheet damping structure comprises two sheets with a viscoelastic damping plane disposed therebetween.

* * * * *